United States Patent
Saxena et al.

(10) Patent No.: US 6,978,229 B1
(45) Date of Patent: Dec. 20, 2005

(54) EFFICIENT METHOD FOR MODELING AND SIMULATION OF THE IMPACT OF LOCAL AND GLOBAL VARIATION ON INTEGRATED CIRCUITS

(75) Inventors: Sharad Saxena, Richardson, TX (US); Carlo Guardiani, San Jose, CA (US); Philip D. Schumaker, Austin, TX (US); Patrick D. McNamara, San Jose, CA (US); Dale Coder, Sunnyvale, CA (US)

(73) Assignee: PDF Solutions, Inc., San Jose, CA (US)

( * ) Notice: Subject to any disclaimer, the term of this patent is extended or adjusted under 35 U.S.C. 154(b) by 885 days.

(21) Appl. No.: 09/675,427

(22) Filed: Sep. 29, 2000

Related U.S. Application Data

(60) Provisional application No. 60/166,242, filed on Nov. 18, 1999.

(51) Int. Cl.[7] .............................................. G06G 7/48
(52) U.S. Cl. ..................... 703/4; 703/2; 703/3; 700/26; 700/28; 700/31; 700/32; 716/4
(58) Field of Search ............................. 703/14, 2, 3, 4; 700/26, 28, 31, 32; 716/4

(56) References Cited

U.S. PATENT DOCUMENTS

| | | | |
|---|---|---|---|
| 3,751,647 A | 8/1973 | Maeder et al. ............. 235/151.11 |
| 4,795,964 A | 1/1989 | Mahant-Shetti et al. ........ 324/60 |
| 4,835,466 A | 5/1989 | Maly et al. .............. 324/158 R |
| 4,939,681 A | 7/1990 | Yokomizo et al. ............. 364/578 |
| 5,067,101 A | 11/1991 | Kunikiyo et al. ............. 364/578 |
| 5,068,547 A | 11/1991 | Gascoyne .................... 307/443 |
| 5,070,469 A | 12/1991 | Kunikiyo et al. ............. 364/578 |
| 5,286,656 A | 2/1994 | Keown et al. ................ 324/158 |
| 5,301,118 A | 4/1994 | Heck et al. .................. 364/468 |
| 5,438,527 A | 8/1995 | Feldbaumer et al. .......... 364/578 |
| 5,486,786 A | 1/1996 | Lee ............................... 327/378 |
| 5,502,643 A | 3/1996 | Fujinaga ....................... 354/488 |
| 5,625,268 A | 4/1997 | Miyanari ...................... 318/696 |
| 5,627,083 A | 5/1997 | Tounai ........................... 438/18 |
| 5,629,877 A | 5/1997 | Tamegaya ..................... 364/578 |
| 5,655,110 A | 8/1997 | Krivokapic et al. .......... 395/500 |
| 5,703,381 A | 12/1997 | Iwasa et al. .................... 257/48 |
| 5,767,542 A | 6/1998 | Nakamura ..................... 57/296 |
| 6,134,191 A | 10/2000 | Alfke ........................... 368/118 |
| 6,184,048 B1 | 2/2001 | Ramon ......................... 438/14 |
| 6,356,861 B1 * | 3/2002 | Singhal et al. ................. 703/2 |

(Continued)

OTHER PUBLICATIONS

Zanella, S.;Nardi, A.;Quarantelli, M.; Neviani, A; Guardiani, C., "Analyis of the impact of intra-die variance on clock skew", Jun. 12, 1999, Statistical Metrology. IWSM. 1999 4th International Workshop on. pp. 14-17.*

(Continued)

*Primary Examiner*—Thai Phan
*Assistant Examiner*—Herng-der Day
(74) *Attorney, Agent, or Firm*—Duane Morris LLP

(57) ABSTRACT

A computer implemented method for statistical modeling and simulation of the impact of global variation and local mismatch on the performance of integrated circuits, comprises the steps of: estimating a representation of component mismatch from device performance measurements in a form suitable for circuit simulation; reducing the complexity of statistical simulation by performing a first level principal component or principal factor decomposition of global variation, including screening; further reducing the complexity of statistical simulation by performing a second level principal component decomposition including screening for each factor retained in the first level principal component decomposition step to represent local mismatch; and performing statistical simulation with the joint representation of global variation and local mismatch obtained in the second level principal component decomposition step.

6 Claims, 3 Drawing Sheets

U.S. PATENT DOCUMENTS

| | | | |
|---|---|---|---|
| 5,773,315 A | 6/1998 | Jarvis | 438/14 |
| 5,778,202 A | 7/1998 | Kuroishi et al. | 395/306 |
| 5,790,479 A | 8/1998 | Conn | 368/118 |
| 5,798,649 A | 8/1998 | Smayling et al. | 324/551 |
| 5,822,258 A | 10/1998 | Casper | 365/201 |
| 5,852,581 A | 12/1998 | Beffa et al. | 365/201 |
| 5,867,033 A | 2/1999 | Sporck et al. | 324/763 |
| 5,903,012 A | 5/1999 | Boerstler | 257/48 |
| 5,966,527 A | 10/1999 | Krivokapic et al. | 395/500.35 |
| 5,982,929 A | 11/1999 | Ilan et al. | 382/200 |
| 6,005,829 A | 12/1999 | Conn | 368/118 |
| 6,063,132 A | 5/2000 | DeCamp et al. | 716/5 |
| 6,066,179 A | 5/2000 | Allan | 716/4 |
| 6,072,804 A | 6/2000 | Beyers, Jr. | 370/450 |
| 6,075,417 A | 6/2000 | Cheek et al. | 331/44 |
| 6,075,418 A | 6/2000 | Kingsley et al. | 331/57 |
| 6,118,137 A | 9/2000 | Fulford, Jr. et al. | 257/48 |
| 6,124,143 A | 9/2000 | Sugasawara | 438/18 |

OTHER PUBLICATIONS

Guardiani, C.; Nicollini, G.; Franzini, B.; Design for manufacturability: a two-step analytic modeling approach;Circuits and Systems, 1992. ISCAS '92. Proceedings., 1992 IEEE International Symposium on, vol.: 4, May 3-6, 1992 pp.: 1997-2000 vol.*

Walton et al., "A Novel Approach for Reducing the Area Occupied by Contact Pads on Process Control Chips", *Proc IEEE 1990 Int. Conference on Microelectronic Test Structures*, vol. 9, Mar. 1990, pp. 75-80.

Beckers and Hilltrop, "The Spidermask: A New Approach for Yield Monitoring Using Product Adaptable Tet Structures", *Proc IEEE 1990 Int. Conference on Microelectronic Test Structures*, vol. 8, Mar. 1990, pp. 61-66.

Liebman et al. "Understanding Across Chip Line Width Variation: The First Step Toward Optical Proximity Correction", SPIE vol. 3051, pp. 124-136.

PCT International Search Report, Mar. 13, 2001.

Conti. M. et al., Parametric Yield Formulation of MOS IC's Affected by Mismatch Effect. IEEE Transactions on Computer-Aided Design of Integrated Circuits and Systems, May 1999, vol. 18, No. 5, pp. 582-596.

To. H. et al., Mismatch Modeling and Characterization of Bipolar Transistors for Statistical CAD. IEEE Transactions on Circuits and Systems-I: Fundamental Theory and Applications, Jul. 1996, vol. 43, No. 7, pp. 608-610.

Felt. E. et al., Measurement and Modeling of MOS Transistor Current Mismatch in Analog IC's, 1994 IEEE/ACM International Conference on Computer-Aided Design, Nov. 1994, pp. 272-277.

Michael. C. et al., A Flexible Statistical Model for CAD of Submicrometer Analog CMOS Integrated Circuits, 1993, IEEE/ACM International Conference on Computer-Aided Design, Nov. 1993, pp. 330-333.

Ogrenci. A. et al., Incorporating MOS Transistor Mismatches Into Training of Analog Neural Networks, Proceedings of NC, International ICSC/IFAC Symposium on Neural Computation, Sep. 1998, Abstract only.

International Search Report dated Apr. 9, 2001.

Khare et al., "Extraction of Defect Characteristics for Yield Estimation Using The Double Bridge Test Structure", IEEE, May 1991, pp. 428-432.

Yun et al., Evaluating the Manufacturability of GaAs/AlGaAs Multiple Quantum Well Avalanche Photodiodes Using Neural Networks, IEEE, Oct. 1997, pp. 105-112.

Hansen et al., "Effectiveness of Yield-Estimation and Reliability-Prediction Based on Wafer Test-Chip Measurements", IEEE, Jan. 1997, pp. 142-148.

Khare et al., "Yield Oriented Computer-Aided Defect Diagnosis", IEEE Trans. on Semiconductor Manufacturing, vol. 8, No. 02, May 2, 1995, pp. 195-206.

International Search Report dated Jun. 8, 2001.

Nurani et al., "In-Line Yield Prediction Methodologies Using Patterned Wafer Inspection Information", IEEE Transactions on Semiconductor Manufacturing, vol. 11, No. 1, Feb. 1998, pp. 40-47.

Y. Cheng et al., "MOSFET Modeling and BSIM User Guide." Kluwer Academic Publishers, Boston, 1999.

Conti et al. "Parametric Yield Formulation of MOS IC's Affected by Mismatch Effect." IEEE Transactions on Computer-Aided Design, vol. 18, pp. 582-596, May 1999.

Guardiani et al., "Applying a submicron mismatch model to practical IC design." IEEE Custom Integrated Circuits Conference, San Diego (CA), May 1994.

Huijsing et al., "Low-Power Low-Voltage VLSI Operational Amplifier Cells." IEEE Transactions on Circuits and Systems-I: Fundamental Theory and Applications, vol. 42, No. 11, pp. 841-852, Nov. 1995.

Hwang, et al., "Universal Constant-gm Input-Stage Architectures for Low-Voltage Op Amps." IEEE Transactions on Circuits and Systems-I: Fundamental Theory and Applications, vol. 42, No. 11, pp. 886-894, Nov. 1995.

Pineda De Gyvez et al., "Integrated Circuits Manufacturability: the Art of Process and Design Integration." pp. 158-166, IEEE Press, New York, 1999.

Felt et al., "Hierarchical Statistical Characterization of Mixed-Signal Circuits Using Behavioral Modeling." IEEE-ACM International Conference on Computer Aided Design, San Jose (CA), Nov. 1996.

Michael et al., "Statistical Modeling for Computer-Aided Design of MOS VLSI Circuits." Kluwer Academic Publishers, Boston, 1993.

Michael et al., "Statistical Modeling of Device Mismatch for Analog Integrated Circuits." IEEE Journal of Solid-State Circuits, vol. 27, No. 2, Feb. 1992.

"pdPCA User's Manual." Version ?, PDF Solutions, Inc., San Jose, 1998.

Pelgrom et al., "Matching Properties of MOS Transistors." IEEE Journal of Solid-State Circuits, vol. 24, No. 5, SC-24, pp. 1433-1440, Oct. 1989.

Sidney Soclof, "Design and Applications of Analog Integrated Circuits." Prentice Hall, New Jersey, 1991.

Strojwas et al., "Manufacturability of Low-Power CMOS Technology Solutions." Invited Paper, International Symposium on Low-Power Electronics and Design, Monterey (CA), Aug. 1996.

Tuinhout et al., "Matching of MOS Transistors." FSA Modeling Workshop, San Jose (CA), May 1999.

Velghe et al., "Compact MOS Modelling for Analogue Circuit Simulation." IEDM Techn. Digest, pp. 485-488, Washing (DC), 1993.

Zhang et al., "Yield and Variability Optimization of Integrated Circuits." Kluwer Academic Publishers, Boston, 1995.

Hanson et al., Analysis of Mixed-Signal Manufacturability with Statistical Technology CAD (TCAD), IEEE Transactions on Semiconductor Manufacturing, vol. 9, No. 4, Nov. 1996.

* cited by examiner

EFFICIENT METHOD FOR MODELING AND SIMULATION OF THE IMPACT OF LOCAL AND GLOBAL VARIATION ON INTEGRATED CIRCUITS

CROSS REFERENCE TO RELATED APPLICATIONS

This application claims the benefit of U.S. Provisional Application Ser. No. 60/166,242 filed on Nov. 18, 1999, the contents of which is incorporated by reference as if fully set forth herein.

BACKGROUND OF THE INVENTION

The present invention pertains to fabrication of integrated circuits and more particularly to methods and systems for analyzing the performance and manufacturability of integrated circuits.

Miniaturization and scaling of integrated circuits have resulted in two conflicting trends. On one hand, margins available in high-performance designs are shrinking, increasing the likelihood that inevitable variations during manufacturing will cause performance violations. On the other hand, both the amount of variation as a fraction of the feature sizes, and the sensitivity of the characteristics of transistors and interconnects to manufacturing variations is increasing. This makes it essential to model and simulate accurately and efficiently the impact of manufacturing variations on the performance of integrated circuits.

Manufacturing variations include intra-die variations, hereinafter referred to as "local mismatch", and inter-die variations, hereinafter referred to as "global variations". Such intra-die and global variations are random and systematic variations in the material composition, or in the processing steps that are used to fabricate the integrated circuits. Local mismatch, or intra-die variations, are differences in the electrical properties of circuit elements that affect components of the circuits that are fabricated on the same die. For example, two identically drawn transistors fabricated next to each other in any particular chip will still present different threshold voltage values. Global variations, or inter-die variations, affect integrated circuit devices by causing random differences in the electrical properties of circuit elements, such as transistors, resistors, capacitors, memory cells, wires, etc., that are fabricated on different chips from the same wafer, on different wafers, or on different batches of wafers. As circuits are designed assuming i) a given nominal value of the electrical properties of its elements and ii) that identically drawn elements behave exactly in the same way, both global variations and local mismatch affect the actual circuit performance and are essential to determine the yield of the product.

Local mismatch has not been adequately modeled in the past. Accurate matching of the electrical properties of active and passive elements is fundamental for functional and parametric performances of analog and mixed-signal integrated performance (IP) blocks, such as operational amplifiers (OPAMPs), digital to analog (D/A) and analog to digital (A/D) converters, phase locked loops (PLLs), etc. Achieving target functional and parametric yield of analog and mixed-signal components frequently represents a major bottleneck for the global time-to-volume performance of complex very large scale integrated (VLSI) systems.

Previous work in modeling and analysis of matching properties of electronic devices, such as that described in the paper entitled "*Matching Properties of MOS Transistors*", Pelgrom M., Dunjnmayer, A., and Welbers A., *IEEE Journal of Solid State Circuits*, Vol SC-24, pp 1433–1440, October 1989, which paper is incorporated by reference in this detailed description as if fully set forth herein, aims at deriving a suitable model of intra-die metal oxide semiconductor field effect transistor (MOSFET) variance as a function of device size, layout distance and orientation. Although these models have become popular, their direct application in the context of electrical circuit simulation is difficult for two main reasons.

First, they model the matching properties of MOSFET "macro" characteristics, such as threshold voltage ($V_{Th}$) saturation current ($I_{DSAT}$) that are only indirectly related to the actual "lowlevel" parameters of most widely used compact SPICE (System Program for Integrated Circuits Emphasis) simulation models, such as BSIM3v3 ("*MOSFET Modeling and BSIM User Guide*", Cheng, Y and Hu, C., Kluwer Academic Publishers, Boston, 1999, incorporated by reference as if fully set forth herein) or MOS9 ("*Compact Modeling for Analogue Circuit Simulation*", Veighe, R., et al., *IEDM Tech. Digest*, pp. 485488, 1993, incorporated by reference as if fully set forth herein). Therefore, a nontrivial inverse modeling process must be applied to extract the proper covariance structure of lowlevel SPICE model parameters corresponding to the available matching characterization data for these macro parameters.

Second, applying a device level mismatch model to the statistical simulation of electronic circuits requires the assumption that every matched device is described by a different set of low-level device parameters, each associated with a corresponding random variable (RV) ("*Statistical Modeling of Device Mismatch for Analog Integrated Circuits*", Michael, C. and Ismail, M., *IEEE Journal of Solid-State Circuits*, Vol 27, No 2, February 1992; "*Applying a Submicron Mismatch Model to Practical IC Design*", Guardiani, C. et al., IEEE CICC Conference, May 1994; "*Hierarchical Statistical Circuit Characterization of Mixed-Signal Circuits using Behavioral Modeling*", Felt et al., IEEE-ACM International Conference on Computer Aided Design, San Jose, Calif., November 1996, all of which are incorporated by reference as if fully set forth herein).

The variance of the relevant circuit performance parameters can then be estimated via MonteCarlo analysis. This process requires the generation of a sequence of correlated vectors of random numbers, and the evaluation of the circuit performance corresponding to each random vector instance either by directly using SPICE or via RSM macro-modeling. The dimensionality of the corresponding RV space can be very large when the simultaneous variation of all matched n-tuples of devices is considered.

The problem associated with the large dimensionality of the mismatch simulation task has not yet been properly addressed. The σ-space approach of Michael and Ismail (cited above), which can be proven to be equivalent to the Choleski factorization technique used by Felt et al. (cited above), requires $$\left[\left[\sum_{i=1}^{nd}(N(m_j)-1)XN(p_j)\right]\right]\sum_{j=1}^{nd}(N(m_j)-1)XN(p_j)$$

different RVs, where, $N(m_j)$ is the number of matched devices of type j, $N(p_j)$ is the number of independent process factors used in the model of the jth device type, and nd is the number of different devices in the circuit.

The empirical approach of Guardiani et al. (cited above), has an even greater complexity, and can be only applied to very simple circuits. Conti ("*Parametric Yield Formulation of MOS ICs affected by mismatch effect*", Conti, M., *IEEE Transactions on Computer Aided Design*, vol 18, pp. 582–596, May 1999, incorporated by reference as if fully set forth herein) proposed a method based on the experimental characterization of a parametrized auto-correlation function for the relevant process parameters described as spatial stochastic processes. The autocorrelation function is then used to derive a symbolic formula for the system covariance matrix as a function of the layout parameters. Therefore, the complexity of this methodology is also proportional to the same number of variables as the σ-space approach, however this technique is compatible with the statistical simulation methodology described herein, and can be used to replace the approach of deriving the component correlation matrix using a mismatch model.

SUMMARY OF THE INVENTION

A method of modeling and simulating the impact of global and local variation on the performance of integrated circuits includes the steps of estimating a representation of component mismatch from device performance measurements in a form suitable for circuit simulation; reducing the complexity of statistical simulation by performing a first level principal component or principal factor decomposition of global variation, including screening; further reducing the complexity of statistical simulation by performing a second level principal decomposition including screening for each factor retained in the step of reducing the complexity; and performing statistical simulation with the joint representation of global and local variation obtained in the step of further reducing the complexity.

A method of modeling and simulating the impact of global and local variation on the performance of integrated circuits includes the following steps. First, convert, if necessary, the device mismatch model at the device performance level into a model suitable for circuit simulation, that is, at the SPICE parameter level. Second, if the global variation is provided, perform a first level principal-component or principal-factor decomposition and screening to represent the global variation. If no global variation is provided, perform this decomposition for the local variation alone. Third, perform a second level principal-component or principal-factor decomposition and screening for each independent factor identified in the second step to represent the local variation and reduce its dimensionality. If no global variation is explained in the initial model before local variation is applied, this step does not apply. Fourth, perform statistical circuit simulation and analysis with the combined set of independent factors that result from the second and/or third steps to estimate the impact of global and local variation jointly and/or separately on the circuit of interest.

DETAILED DESCRIPTION OF THE INVENTION

Figure 1:
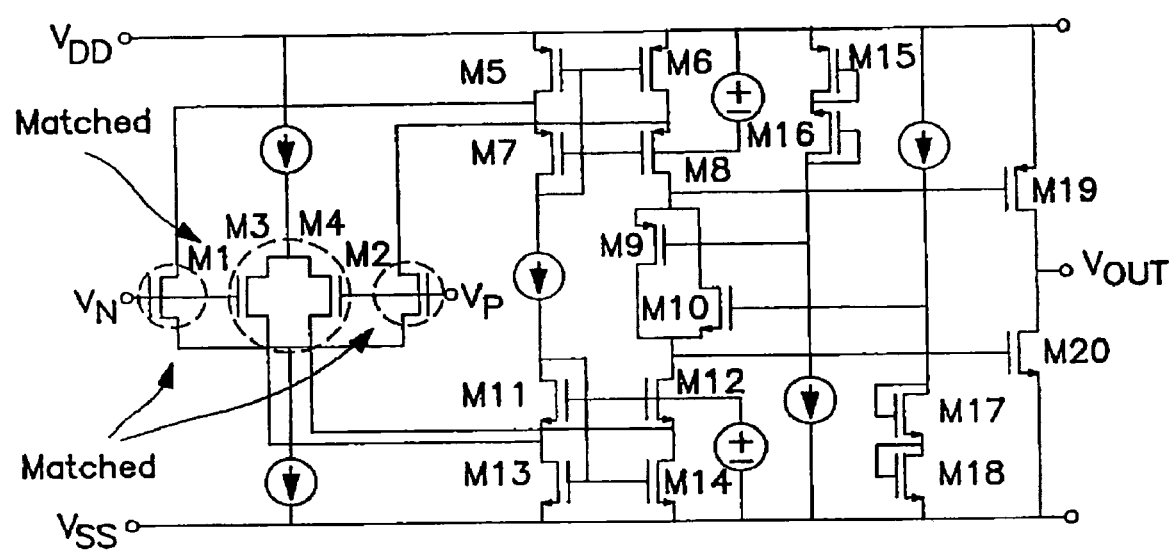
FIG. 1 is a schematic of a low-voltage opamp used for illustrating the method of the present invention.

In accordance with the present invention, an efficient representation of both inter-die and intra-die variation is constructed to analyze the joint impact of these sources of process variation on a design. The impact of manufacturing variations on a component is typically represented by estimating the distribution of SPICE model parameters for that component. A statistical SPICE model that represents both inter-die and intra-die variations has to account for two types of correlation; that is, correlation between model parameters and correlation between matched components. The correlation between model parameters arises because most commonly used SPICE models utilize non-independent parameters. The correlation between different components on the same die arises because of intra-die process variation.

Both the inter-die and intra-die correlation can be represented in a single correlation matrix. Given n matched components ($C_1, \ldots, C_n$) and a SPICE model for each component with m parameters ($P_1, \ldots P_m$) a straightforward implementation would construct a nm×nm correlation matrix:

$$\begin{bmatrix} 1 & \rho_{11,12} & \cdots & \rho_{11,nm} \\ \rho_{12,11} & 1 & \cdots & \rho_{12,nm} \\ \cdots & \cdots & \cdots & \cdots \\ \rho_{nm,11} & \cdots & \rho_{nm,n(m-1)} & 1 \end{bmatrix} \quad (1)$$

where the rows and columns are $T_i p_j$, representing parameter j for transistor i. The element $\sigma_{ij,kl}$ represents the correlation between $T_i p_j$ and $T_k p_l$.

This representation is computationally very expensive since the matrix grows as O(nm×nm). Two simplifications are realized by using principal component (PC) decomposition. The first simplification is the use of PCS to represent the correlation between the model parameters and the second simplification is the use of PCS to represent the correlation between the matched devices.

Inter-die Principal Component Decomposition

Principal component representation expresses a set of correlated random variables in terms of a set of independent random variables. This is obtained by applying a congruence transformation of the form: $\Gamma \Sigma \Gamma^T = \Lambda$ to the covariance (or correlation) matrix $\Sigma$, such that $\Gamma$ is an orthogonal matrix and $\Gamma$ is diagonal matrix, its elements $\lambda_{ii}$ are the eigenvalues of the covariance matrix. An important property of principal component decomposition is that:

$$\sigma_q^2 = \left(\sum_{i=1}^{q} \lambda_{ii}\right) / \left(\sum_{i=1}^{n} \lambda_{ii}\right) \quad (2)$$

represents the fraction of the variance explained by the first $q$ PCs. By replacing the model parameters ($p_1, \ldots, p_m$) by PCS ($f_1, \ldots, f_k$) in the Eq. (1) one gets a nk×nk size matrix, where typically k<<m. The reduction in the matrix size stems from the application of a suitable threshold filtering algorithm based on Eq. (2). However, further simplifications are possible because using PCS instead of model parameters makes the correlation matrix very sparse. Because the PCS are independent, the correlation between different factors for the same component is zero, i.e., $\rho_{il,m}=0$ for $l \neq m$. Moreover, since the PCS are considered to represent independent sources of variations, correlation between different parameters on different transistors is also taken to be zero., i.e., $\rho_{ij,kl}=0$ for $i \neq k$ and $j \neq l$. This leaves only one set of nonzero entries in the correlation matrix between the same factor for different matched components, i.e., $\rho_{iljl}$.

Intra-Die Principal Component Decomposition

The correlation matrix is further simplified by using a second level of PC decomposition, replacing a PC of the original model, e.g., f, by a linear combination of a set of second-level PCS representing the intra-die variation. The result of the second PC decomposition is a unified representation that captures both the correlation between the model parameters and the matched components. Moreover, the transformation maintains the correlation between the model parameters because the RV for each original PC is replaced by an equivalent equation with the same mean and variance. The second level PC transformation adds, at worst, n new PCS, resulting in a total of n×k PCS. Since the statistical SPICE model is independent of the application, the number of PCS k is fixed, and usually k<<m, where m is the number of model parameters. This results in a mismatch simulation method that adds only O(n) new RVs for a circuit with n matched components.

An advantage of the approach of the present invention is that in practice the number of factors required is scarcely the n×k factors required in the worst case. This happens for two reasons. First, not all k PCS required to capture the correlation of the model parameters are necessary for representing mismatch. Usually, a much smaller number of variables are required. Second, because the amount of mismatch is typically very small, the correlation matrix is, in general, characterized by a small number of dominant eigenvalues. Therefore, using the equation that gives the fraction of total variance explained by the k-th PCS, the variance of the system can be well approximated by using a small number of PCS compared to the worst-case n.

For example, in the asymptotic case of perfectly matched devices, this method automatically produces only one PC (corresponding to the dominant eigenvalue) for each independent process factor, resulting in no increase in the number of RVs. In the intermediate situations between the worst-case and the asymptotic case, the approach of the present invention provides an approximation scheme where a small number of PCS can be selected to accurately approximate the correlation between the components.

Statistical SPICE Models with Mismatch

Mismatch characterization typically does not produce the correlation between PCS of a statistical SPICE model. Usually, the result of mismatch characterization is a set of coefficients for a mismatch model of device performance. For example, MOS transistor mismatch characterization often results in the coefficients of a Pelgrom-style model for threshold voltage ($V_{Th}$) and saturation current ($I_{DSAT}$) or the transistor gain-factor (k') (see the Pelgrom, et al reference cited above). To utilize this information in the representation described above it must be converted into correlation between PCS of the statistical SPICE model.

The procedure for determining the unified statistical representation starts with a statistical SPICE model for correlation between model parameters. A subset of the PCS of this model is selected for representing component mismatch. The selection is based on two considerations: the device characteristics for which mismatch has been characterized, and the weightings of the different PCS in the equation for each SPICE parameter that impact these device characteristics. For example, if mismatch characterization has been performed for threshold-voltage and gain-factor of longchannel MOSFETs, then PCS that have the most impact on the VTH0 and U0 (mobility) parameters of the BSIM3v3 model are selected. Once the PCS of the model without mismatch have been selected, a numerical optimization is performed to find the correlation between these factors in order to obtain the measured mismatch in device characteristics.

Each optimization results in the correlation of the selected PC for one set of device geometry and layout parameters. Repeating this procedure for different geometries and layout distances results in a set of correlation values that are either fit with an interpolating function or represented in a look-up table. This procedure results in a model of PC correlation as a function of device geometry and layout. The step of modeling PC correlation as a function of device geometry and layout is performed only once for a particular technology and layout style.

The method of the present invention can be used as part of the Circuit Surfer statistical design and verification environment. This environment supports many tasks typically required for analog and mixed signal design for manufacturability, such as statistical simulation, sensitivity analysis, response surface modeling, and circuit optimization for manufacturability. Mismatch simulation is implemented in this environment as an annotation of the circuit netlist to specify the matched components, and annotations to the statistical SPICE models to include the effect of mismatch. The annotated netlist and SPICE models are used to derive a separate statistical SPICE model for each component using the twolevel PCA. The modified netlist forms the input to Circuit Surfer. This implementation enables all the capabilities of statistical design for mismatch analyses such as variable screening, response surface modeling and Monte-Carlo using mismatch factors, and optimization of a design to reduce its mismatch sensitivity.

The use of the present invention is illustrated with two applications: a low voltage OPAMP and a D/A Converter. These topologies were implemented based on their continued significance in low voltage VLSI signal processing applications and their performances sensitivities to device mismatch characteristics.

Low Voltage OPAMP

The following is a description of an embodiment of the method, in accordance with the present invention, for statistical modeling and simulation of the impact of global variations and local mismatch on the performance of operational amplifiers (OPAMPs) of the type described. Such local mismatch and global variations are typically caused by random and systematic variations in the material composition, or in the processing steps that are used to fabricate the integrated circuits. Global variations affect integrated circuit devices by causing random differences in the electrical properties of the circuit elements, such as transistors, resistors, capacitors, memory cells, wires, etc., that are fabricated on different chips from the same wafer, on different wafers, or on different batches of wafers. The local mismatch, or intra-die variations, are differences in the electrical properties of circuit elements that affect components of circuits that are fabricated on the same die. For example, two identically drawn transistors, fabricated next to each other in any particular chip, will still present different threshold voltage values.

The OPAMP is of the 2-stage rail-to-rail class-AB architecture shown in FIG. 1 which employs a constant-$g_m$ input stage with tail current control. The commonality of complimentary input stages in contemporary designs makes this topology ideal for exploring the effects of mismatch on offset voltage (Vos) given both NMOS and PMOS mismatch effects. In addition, low voltage design examples such as this help exploit the increasing dependence of proper signal resolution on low Vos. A Pelgrom model for the mismatch in the threshold voltage and gain factor of long-channel transistors is available for this class of technologies. For the matched NMOS pair M1–M2, the model specifies $\sigma(\Delta(Vth))$ =2 mV and $\sigma(\Delta(k'))$=0.7%. For the PMOS pair M3–M4, the mismatch was: ($\sigma(\Delta(Vth))$=1.5 mV and $\sigma(\Delta(k'))$=0.45%, where Vth represents the MOSFET threshold voltage and k' represents the MOSFET gain factor.

A statistical SPICE model was estimated for the process technology used in this example. The model was estimated using measured variance and correlation between key transistor performances. This set of performances includes: transistor drive current in the linear and saturation regions (Idsat, Idlin) and transistor threshold voltage in the linear and the saturation region (Vtsat, Vtlin). The statistical SPICE model is represented in terms of principal factors, thus achieves the effect of first-level principal component decomposition.

The mismatch model described above is not suitable for direct use in circuit simulation. A SPICE level representation of mismatch is derived by selecting SPICE model parameters that effect long-channel threshold voltage and the gain factor. For BSIM3v3 SPICE models, these parameters are VTH0, TOX, and U0. Numerical optimization is performed to find the correlation between these factors in order to obtain the measured mismatch in threshold voltage and gain factor.

The statistical model including mismatch was used to simulate the impact of mismatch on key performance measures on this design. This simulation makes use of the method of this invention to perform the second level principle component decomposition. The impact of mismatch on this design is shown in Table 1.

TABLE 1

Impact of Mismatch on OPAMP (10,000 sample Monte-Carlo)

| | Without Mismatch | | With Mismatch | |
|---|---|---|---|---|
| Performance | Mean | std. dev | Mean | std. dev |
| Vos (mV) | −1.803 | 0.09627 | −1.802 | 0.7216 |

A unified model is derived by applying the method described in the previous sections. The first level PCA results in nine first level PCS (pca1 . . . pca7, pcalint and pcawint) for the four matched transistors, thus resulting in a 36×36 sparsified covariance matrix. A second level PCA is performed using this matrix. Three dominant eigenvalues explain over 98% of the total variance. In this way, it is possible to account for both inter-die and intra-die variations with the addition of three variables. These three variables are suitably obtained by re-defining pca2, pca4 and pca5 as linear combinations of two independent components.

Figure 2:
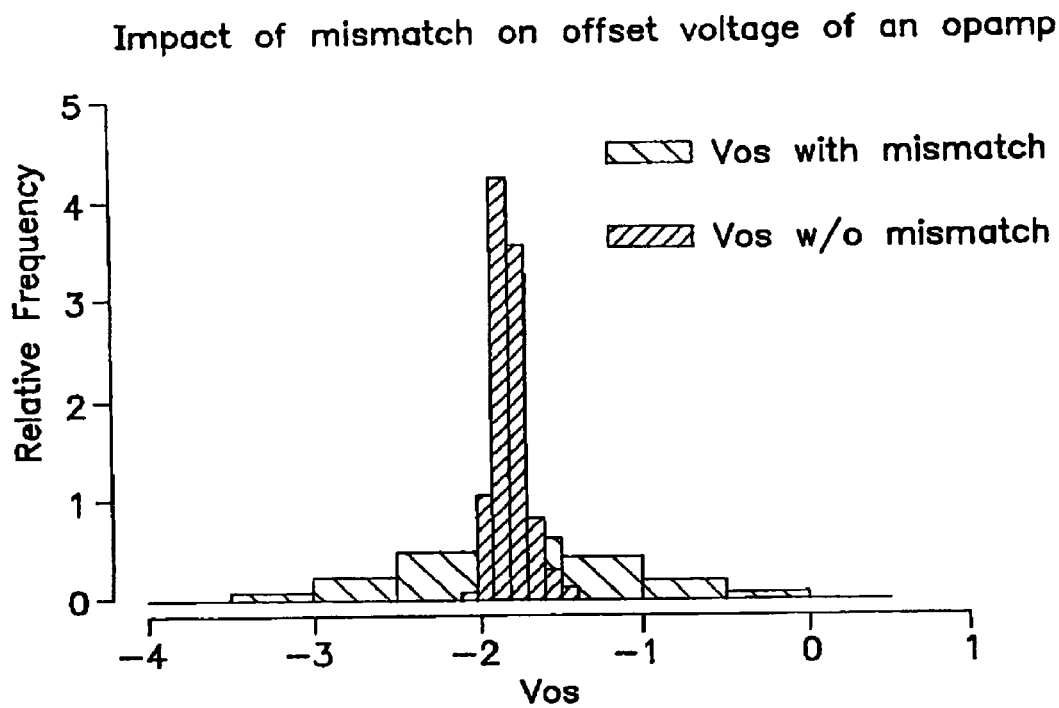
FIG. 2 is a histogram showing the impact of mismatch on the input offset voltage of the opamp shown in FIG. 1.

Two sets of Monte-Carlo simulations were performed, one using only the inter-die model and the second using the unified model. As expected, this design shows that Vos is extremely sensitive to mismatch. By quantifying the exact impact of mismatch the method of the present invention allows an accurate assessment of manufacturability of this topology. It also shows that parametric yield estimates can be overly optimistic for designs sensitive to mismatch if mismatch effects are not accounted for in statistical simulation or worst-case models. FIG. 2 shows the distribution of Vos with and without mismatch. The overlay illustrates the 7× increase in the offset voltage standard deviation. Without the ability of efficient and accurate mismatch analysis the impact on parametric yield due to this increase would be missed.

D/A Converter

Figure 3:
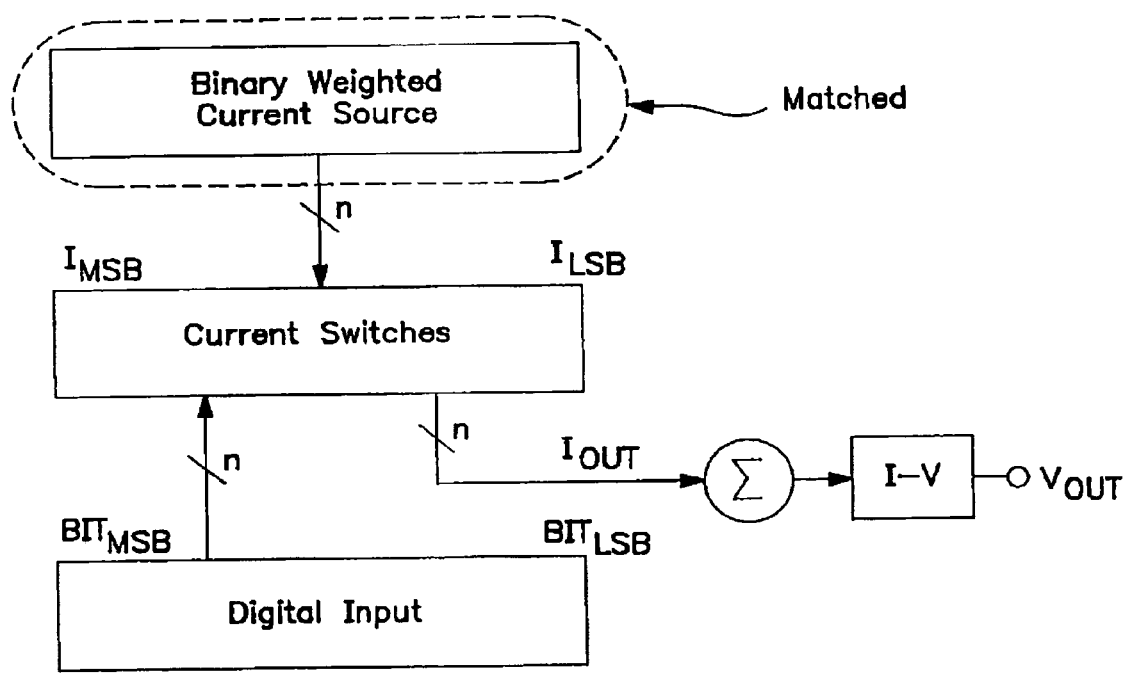
FIG. 3 is a block diagram of a digital to analog converter used for illustrating the method of the present invention on circuits involving matching of more than two components at a time.

The D/A Converter shown in FIG. 3 uses a binary weighted current implementation with eight-bit resolution. The output current is summed via current switching and output to a linear current/voltage (I-V) converter. Data converter non-linearity is a measure of the error induced by the converter and it is sensitive to the matching between the transistors comprising the ratioed current source.

Simulation with and without intra-die variation was carried out as described for the OPAMP. The procedure was deriving the statistical SPICE model using principal-factors and estimating a representation of device mismatch in form of a SPICE model are identical to those for the OPAMP. The simulation was carried out using the method of this invention. The mismatch effects were examined for the binary weighted current source identified in FIG. 3. Specifically, the analog output was tested for differential non-linearity (DNL), defined as the deviation of each set of adjacent steps at the analog output from their ideal value (1 LSB). Here, we have defined the performance specification to be +/−½ LSB. The results of statistical simulation with and without intra-die effects are shown in Table 2.

TABLE 2

Impact of Mismatch on D/A Converter
(10,000 sample Monte-Carlo)

| | Without Mismatch | | With Mismatch | |
|---|---|---|---|---|
| Performance | Mean | std. dev | Mean | std. dev |
| DNL (LSB) | −0.176 | 0.086 | −0.198 | 1.155 |
| Yield | 100% | | 34% | |

Intra-die variation causes the standard deviation of DNL to increase by a factor of 13. Such a large increase in the increment causes large changes in the linearity of the D/A Converter. As in the previous example, including intra-die effects is vital to get accurate estimation of circuit performance variability, but since the circuit's performance for this topology depends upon the pairwise matching of eight different transistors, a complete statistical simulation using a standard methodology would entail running a Monte-Carlo experiment with large number of correlated RVs.

Figure 4:
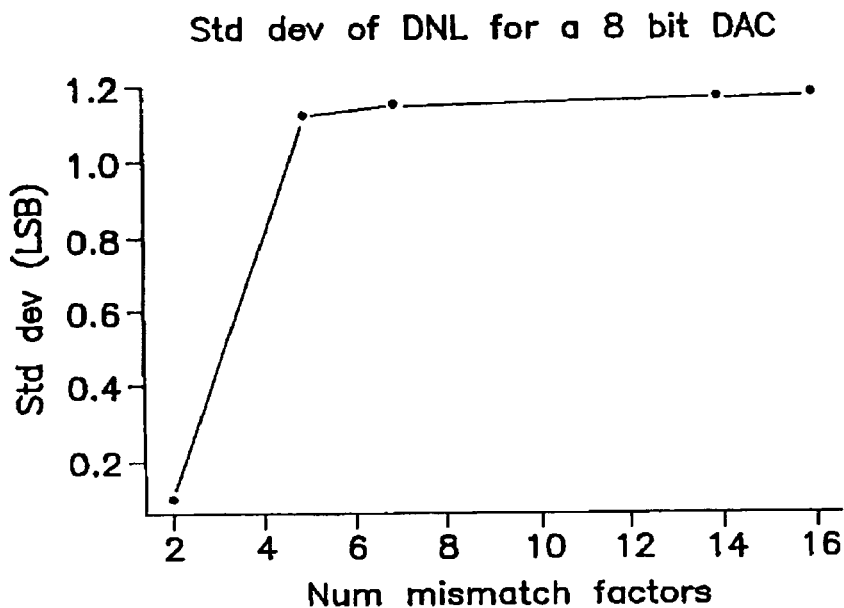
FIG. 4 is a graph showing the efficiency of principal component analysis followed by screening in reducing the complexity of statistical simulation including global and local effects.

For example, a circuit with eight matched transistors and 7 to 12 independent sources of process variation (typical of advanced CMOS processes) requires the generation of a sequence of correlated random numbers for as many as 96 different RVs. Several thousand SPICE evaluations would be required to stabilize the Monte-Carlo results for such a high-dimensional system. The advantages of complexity reduction using second order principal component decomposition are illustrated by the graph depicted in FIG. 4. This figure shows the standard deviation of DNL versus the number of additional factors employed for mismatch simulation. In fact, although in the worst case the present technique would require 18 additional RVs, by applying the screening methodology previously described under the heading "Intra-die Principal Component Decomposition" above, it is possible to model very accurately the impact of intra-die variability on the D/A Converter with only two additional variables. This result makes the simulation of mismatch applicable to an inherently larger set of matched transistors; a requirement as supply levels and feature sizes continually decrease and previously negligible device effects become increasingly significant.

We claim:

1. A computer implemented method for statistical modeling and simulation of the impact of global variation and local mismatch on the performance of integrated circuits, comprising the steps of:
   (a) estimating a representation of component mismatch from device performance measurements in a form suitable for circuit simulation;
   (b) reducing the complexity of statistical simulation by performing a first level principal component or principal factor decomposition of global variation, including screening;
   (c) further reducing the complexity of statistical simulation by performing a second level principal component decomposition including screening for each factor retained in step (b) to represent local mismatch; and
   (d) performing statistical simulation with the joint representation of global variation and local mismatch obtained in step (c).

2. The method of claim 1 where the first principal component or principal factor decomposition is performed using eigenvalue eigenvector decomposition.

3. The method of claim 1 where the second principal component or principal factor decomposition is performed using eigenvalue eigenvector decomposition.

4. A computer implemented method for statistical modeling and simulation of the impact of global variation and local mismatch on the performance of integrated circuits, wherein said method is integrated in a statistical design and optimization computer aided design tool to perform statistical simulation of joint and separate impact of global variation and local mismatch on performance of integrated circuits and said method comprises the steps of:
   (a) estimating a representation of component mismatch from device performance measurements in a form suitable for circuit simulation;
   (b) reducing the complexity of statistical simulation by performing a first level principal component or principal factor decomposition of global variation, including screening;
   (c) further reducing the complexity of statistical simulation by performing a second level principal component decomposition including screening for each factor retained in step (b) to represent local mismatch; and
   (d) performing statistical simulation with the joint representation of global variation and local mismatch obtained in step (c).

5. The method of claim 4 where the first principal component or principal factor decomposition is performed using eigenvalue eigenvector decomposition.

6. The method of claim 4 where the second principal component or principal factor decomposition is performed using eigenvalue eigenvector decomposition.

* * * * *